United States Patent
Lee et al.

(10) Patent No.: US 7,277,284 B2
(45) Date of Patent: Oct. 2, 2007

(54) MICROCHANNEL HEAT SINK

(75) Inventors: Poh-Seng Lee, West Lafayette, IN (US); Suresh V. Garimella, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 11/511,661

(22) Filed: Aug. 29, 2006

(65) Prior Publication Data

US 2007/0025082 A1    Feb. 1, 2007

Related U.S. Application Data

(63) Continuation of application No. PCT/US2004/042801, filed on Dec. 8, 2004.

(60) Provisional application No. 60/557,784, filed on Mar. 30, 2004.

(51) Int. Cl.
*H05K 7/20* (2006.01)

(52) U.S. Cl. ............... 361/699; 361/702; 361/711; 257/713; 257/714; 165/80.2; 165/80.4

(58) Field of Classification Search ........ 361/688–692, 361/697–704, 709–714; 62/3.2, 3.3, 259.2; 257/713–715, 721; 174/15.1, 16.1; 165/80.3, 165/80.4, 104.33, 104.59, 126, 135, 136, 165/139, 143, 168, 170, 174, 175, 185
See application file for complete search history.

(56) References Cited

U.S. PATENT DOCUMENTS

| | | | |
|---|---|---|---|
| 4,450,472 A | 5/1984 | Tuckerman et al. | 257/713 |
| 4,573,067 A | 2/1986 | Tuckerman et al. | 257/713 |
| 4,953,634 A | 9/1990 | Nelson et al. | 165/147 |
| 5,002,123 A * | 3/1991 | Nelson et al. | 165/147 |
| 6,101,715 A * | 8/2000 | Fuesser et al. | 29/890.03 |
| 6,337,794 B1* | 1/2002 | Agonafer et al. | 361/690 |
| 6,400,012 B1 | 6/2002 | Miller et al. | 257/712 |
| 6,812,563 B2* | 11/2004 | Go et al. | 257/715 |
| 6,867,973 B2* | 3/2005 | Chang | 361/699 |
| 6,934,154 B2* | 8/2005 | Prasher et al. | 361/699 |
| 6,992,382 B2* | 1/2006 | Chrysler et al. | 257/717 |
| 6,994,151 B2* | 2/2006 | Zhou et al. | 165/80.4 |
| 7,156,159 B2* | 1/2007 | Lovette et al. | 165/104.33 |

OTHER PUBLICATIONS

Tuckerman and Pease, "High Performance Heat Sinking for VLSI", IEEE Electron Device Letters, vol. EDL-2, pp. 126-129, 1981.
Garimella and Sobhan, "Transport In Microchannels—A Critical Review", Annual Review of Heat Transfer, vol. 14, 2003.
Phillips, R.J., "Microchannel Heat Sinks", Ph.D.Thesis, Massachusetts Institute of Technology, 1987.

(Continued)

*Primary Examiner*—Michael Datskovskiy

(57) ABSTRACT

A microchannel heat sink as well as method includes one or more microchannels through which a working fluid flows to remove heat from a heat-generating component, such as a microelectronic chip, and one or more recesses disposed in a surface communicated to the one or more of the microchannel to enhance heat transfer rate of the microchannel heat sink. The recesses can be located in a surface of a cover that closes off the microchannels. The one or more recesses can be located at one or more local hot spot regions to enhance heat transfer rates at the local regions as well as overall heat removal rate of the heat sink.

15 Claims, 3 Drawing Sheets

OTHER PUBLICATIONS

Copeland, et al., "Manifold Microchannel Heat Sinks: Isothermal Analysis", IEEE Trans. Compon. Pack. Manuf. Technol., pp. 96-102, 1997.

Wirtz, et al., "Effect of Flow Bypass on the Performance of Longitudinal Fin Heat Sinks", ASME Journal of Electronic Packaging, vol. 116, pp. 206-211, 1994.

* cited by examiner

MICROCHANNEL HEAT SINK

This application is a continuation of International Application No. PCT/US2004/042801 filed on Dec. 8, 2004, which claims benefits and priority of provisional application Ser. No. 60/557,784 filed on Mar. 30, 2004.

CONTRACTUAL ORIGIN OF THE INVENTION

The invention was made in part with United States Government support under grant/contract Number 670-1288-6398 awarded by the National Science Foundation (NSF I/UCRC). The Government may have certain rights in the invention.

FIELD OF THE INVENTION

The invention relates to a microchannel heat sink having improved rates of heat transfer.

BACKGROUND OF THE INVENTION

Rapidly decreasing features sizes and increasing power density in microelectronic devices has necessitated development of novel cooling strategies to achieve very high heat removal rates from these devices. For example, heat removal rates in excess of 200 W/cm$^2$ have been projected for the next generation of personal computing devices. Microchannel heat sinks have the potential to achieve these heat removal rates and therefore have been studied for over two decades as described, for example, by Tuckerman and Pease "High performance heat sinking for VLSI", IEEE Electron Device Letters, Vol. EDL-2, pp. 126–129, 1981, and by Garimella and Sobhan "Transport in microchannels-A critical review" Annual Review of Heat Transfer, Vol. 14, 2003.

However, conventional microchannel heat sinks experience deterioration in thermal performance along their length as the boundary layers continue to develop and thicken with downstream fluid travel. Moreover, hot spots of elevated temperature can develop at local regions of the heat-generating component, such as a microelectronic chip, and thus at local regions of the microchannels.

There is a need for a microchannel heat sink that provides improved overall heat transfer. There also is a need for a microchannel heat sink that provides localized heat transfer that can be tailored to one or more particular hot spots of a heat-generating component, such as a microelectronic chip.

SUMMARY OF THE INVENTION

The present invention provides in one embodiment a microchannel heat sink as well as method that includes one or more microchannels for receiving a working fluid flows to remove heat and one or more recesses disposed in a surface communicated to the one or more of the microchannels to enhance heat removal rate of the microchannel heat sink.

In an illustrative embodiment of the invention, the one or more recesses can be located at one or more local hot spot regions of a heat-generating component to enhance heat transfer rates at the local regions as well as the overall heat removal rates of the heat sink.

In another illustrative embodiment of the invention, the heat sink includes a cover that closes off the one or more microchannels. The cover has the one or more recesses in a cover surface facing the microchannels such that the recesses communicate to the microchannels and thus the working fluid to enhance heat transfer rate of the microchannel heat sink.

In still another illustrative embodiment of the invention, the one or more recesses are elongated and extend in a direction transverse to the long axis of the microchannels across one, some, or all of the microchannels so as to communicate to one, some or all of the microchannels.

In a particular embodiment of the invention, the microchannel heat sink comprises a plurality of elongated microchannels through which a working fluid flows to remove heat and a cover that closes off an open side of the microchannels. The cover includes one or more recesses in a cover surface facing the microchannels such that the recesses communicate to the microchannels and thus the working fluid to enhance heat transfer rate of the microchannel heat sink. The recesses can extend in a direction transverse, preferably perpendicular, to the long axis of the microchannels.

The invention is advantageous to provide enhancement of localized heat transfer rates to lower maximum chip temperatures in microelectronic apparatus as well as to achieve lower temperature gradients on chips to reduce thermal stresses, improve reliability and increase chip performance. These advantages are achieved using the one or more recesses to provide passive flow modulation with a smaller pressure drop across the microchannels and hence with a lower pumping power.

Other advantages of the invention will become more readily apparent from the following description.

DESCRIPTION OF THE INVENTION

The present invention provides an improved microchannel heat sink as well as method embodying the heat sink, having enhanced localized and global (overall) heat transfer rates, and useful for, although not limited to, removing heat from a heat-generating electronic component, such as for purposes of illustration and not limitation, a microelectronic IC chip (integrated circuit chip) of an electronic device such as cell phones, laptop computers, personal digital assistance devices, desktop computers, and the like. A microchannel heat sink as well as method pursuant to an embodiment of the invention that includes one or more microchannels through which a working fluid flows to remove heat from a heat-generating component, such as a microelectronic chip, and one or more recesses disposed in a surface communicated to the one or more of the microchannels to enhance local and overall heat removal rate of the microchannel heat sink. For purposes of illustration and not limitation, an embodiment of the invention will be described below in connection with FIGS. 1-3 where the recesses R are shown disposed in a lid or cover 30 that closes off the open sides of elongated microchannels 20 formed directly in the heat-generating component, such as a microelectronic chip substrate. However, the invention is not limited to this illustrative embodiment since the recesses can be disposed in any surface bordering or defining one or more of the microchannels so that the recesses are in fluid flow communication with the working fluid flowing therethrough to remove heat. For example, although the recesses are shown in FIGS. 1-3 disposed in the lid or cover, the recesses can be disposed in surfaces of the microelectronic chip substrate itself that define one or more of the microchannels.

Figure 1:
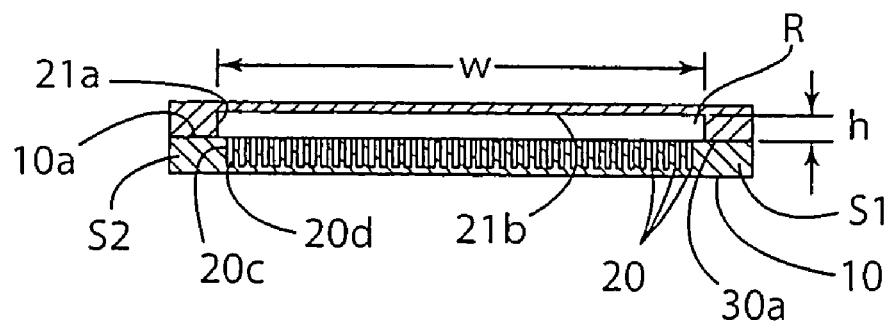
FIG. 1 is a sectional view of the heat sink on a substrate, such as a microelectronic chip, taken along lines 1-1 of FIG. 2.
Figure 2:
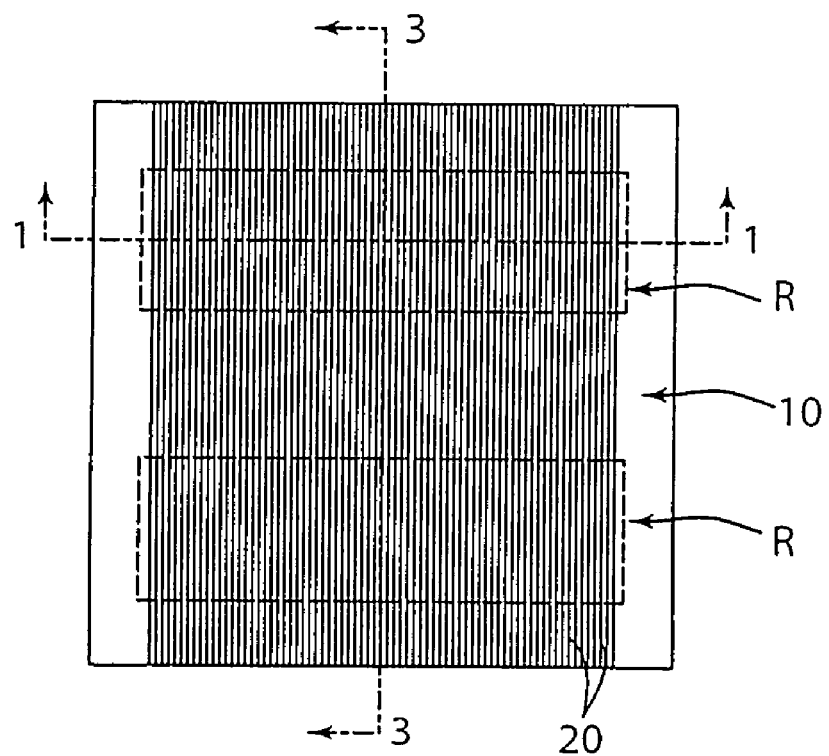
FIG. 2 is a plan view of the microelectronic chip having the microchannels thereon with the recesses of the cover superimposed over the microchannels in dashed lines. The cover is not shown per se so as to allow the microchannels to be shown by solid lines.
Figure 3:
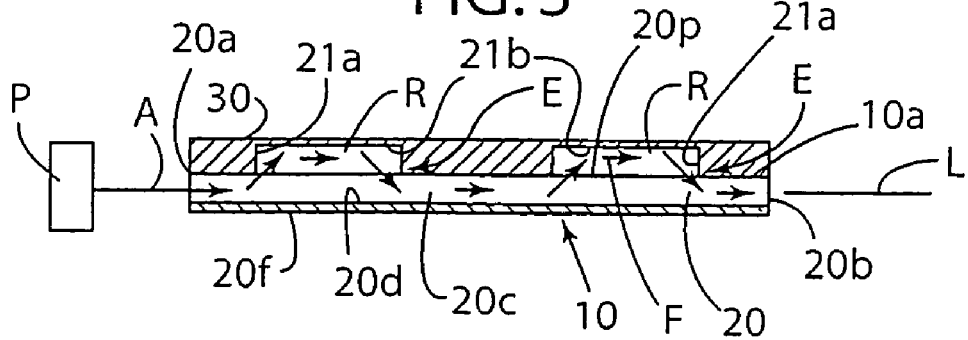
FIG. 3 is a sectional view of the heat sink on a substrate, such as a microelectronic chip, taken along lines 3-3 of FIG. 2.

Referring to FIGS. 1-3, heat-generating microelectronic chip substrate 10 (e.g. a silicon microelectronic chip) is shown having a surface 10a with a plurality of elongated microchannels 12 formed to a depth therein so as to be in heat transfer relation with the chip substrate 10. The microchannels 12 preferably are formed integrally on the surface 10a of the chip substrate 10 using silicon micromachining processes or other suitable fabrication processes. Alternately, the microchannels 20 can be formed as a separate body (not shown) that is joined to the heat-generating chip substrate 10 in a manner that provides heat transfer from the heat-generating chip substrate 10 to the separate body containing the microchannels. The surface 10a can be any appropriate surface of the heat-generating chip substrate 10 and is not limited to the upwardly facing surface 10a shown for purposes of illustration and into limitation in FIGS. 1-3. Moreover, although the microchannels 20 are shown having a rectangular cross-section, FIG. 1, the invention is not so limited as the microchannels 12 can have any appropriate shape.

The elongated microchannels 20 each extend from the channel inlet 20a at an edge of the chip substrate 10 where working fluid A (such as for example air or any other gaseous or liquid fluid) enters for flow along the microchannels to outlet 20b at an opposite edge where working fluid that has absorbed heat from the chip substrate 10 is discharged to an external heat exchanger (not shown) and then circulated back into the inlets 20a of the microchannels 20 in closed loop manner, if desired, or to atmosphere in open loop manner in the event that air is the working fluid. An external or integrated pump P can be used to drive the working fluid through the microchannels of the heat sink. Conventional inlet and outlet manifolds/plenums having fluid supply and discharge ports communicated to inlet and outlets 20a, 20b, respectively, and forming no part of the invention can be included to reduce maldistribution of fluid flow. The working fluid can comprise a liquid (e.g. a dielectric liquid or water) or a gas (e.g. air) of any type heretofore used as a working fluid to remove heat from a heat-generating microelectronic component.

The microchannels 20 extend part way through the thickness of the chip substrate 10 such that the substrate itself forms facing side walls 20c and a bottom wall 20d of each microchannel to provide a thermal transfer relation between the microchannels 20 and the chip substrate 10. For purposes of illustration, the microchannels 20 typically each have a cross-sectional dimension of 40,000 microns$^2$, such as from 1000 to about 5,000,000microns$^2$. For purposes of further illustration and not limitation, the microchannels 20 can have an exemplary height of 400 microns and a width of 100 microns. Although the microchannels 20 are illustrated as having a rectangular cross-sectional shape, they can have any suitable other cross-sectional shape.

A lid or cover 30 is shown closing off the open sides 20p of the microchannels 20. The lid or cover 20 in effect borders or defines the upper surface of the microchannels 20 as illustrated in FIG. 3. The lid or cover 30 can be made of any suitable material including but not limited to, plastic, glass, ceramic, silicon, composite or other material. An exemplary material for the lid or cover 30 can comprise glass, silicon, or copper.

Pursuant to an illustrative embodiment of the invention, the lid or cover 30 is provided with one or more recesses R in a cover surface 30a facing the microchannels 20 such that the recesses R communicate to the microchannels and thus to the working fluid A flowing therein in a manner to enhance localized and overall heat removal rate of the microchannel heat sink 10.

Referring to FIGS. 1-3, multiple (e.g. two) recesses R are shown elongated and extending in a direction transverse (preferably perpendicular as shown) to the long axis of the microchannels 20 so as to, in effect form two grooves 21 extending across the cover 30 and across the microchannels 20. Each recess R is defined by four side surfaces 21a and a top surface 21b of the grooves. The side surfaces 21b are illustrated to extend in a direction perpendicular to the long axis of the microchannels 20.

Although the recesses R are shown extending transversely across all of the microchannels 20 from side S1 to side S2 of the substrate 10, the recesses instead could extend transversely across only some or only one of the microchannels 20 depending upon the heat removal rates needed for a given service application. The number of recesses R provided along the lengths of the microchannels 20 can be varied as desired. The recesses R are provided to modulate the flow of the working fluid A as illustrated in FIG. 3 where the arrows F show increased localized flow rate of the working fluid relative to the recesses R in a manner that leads to higher rates of heat transfer without the penalty of increased pressure head, since the presence of the recesses R reduces the overall flow friction. The dimensions, locations and number of recesses R in the cover 30 can be selected empirically to this end.

As mentioned, the recesses R are shown extending transversely across all of the microchannels from side S1 to side S2 of the chip substrate 10. The microchannels 20 are thereby interconnected transversely by the recesses R as shown in FIG. 1.

For example, both the maximum and average temperatures of the walls of the microchannels 20 are decreased as a result. For example, FIG. 4 includes a graph of heat sink base temperature (base 20f) versus axial location along a microchannel 20 pursuant to the invention (designated MODIFIED MICROCHANNEL) having two recesses R along its length at the axial locations shown determined by computer simulation software (e.g. commercially available CFD software package FLUENT 6.0 to compute the laminar flow and heat transfer in the microchannel). For comparison, FIG. 4 includes a graph of heat sink base temperature versus axial location along a microchannel 20 pursuant to a conventional microchannel (designated CONVENTIONAL MICROCHANNEL) not having recesses R determined by the same computer simulation software.

The computer simulation was determined using two recesses R in the cover 30 as shown in FIGS. 1-3 wherein each recess R had a width "w" of 2.5 millimeters and a height "h" of 400 microns for a microchannel length along axis L of 10 millimeters and microchannel width of 100 microns perpendicular to axis L. The cover had a thickness of 500 microns. The chip substrate 10 had a length of 10 millimeters such that the microchannel 20 extended all of the way across the chip substrate 10. The total thickness of the chip substrate was 100 microns. The width of solid chip substrate material between the microchannels (fin width) was 100 microns. For the simulation, water was flowed through the microchannels 20 by a pressure head of 10 kPa. A uniform heat flux of 100 W/cm$^2$ was supplied to the base 20f of the substrate 10.

Figure 4:
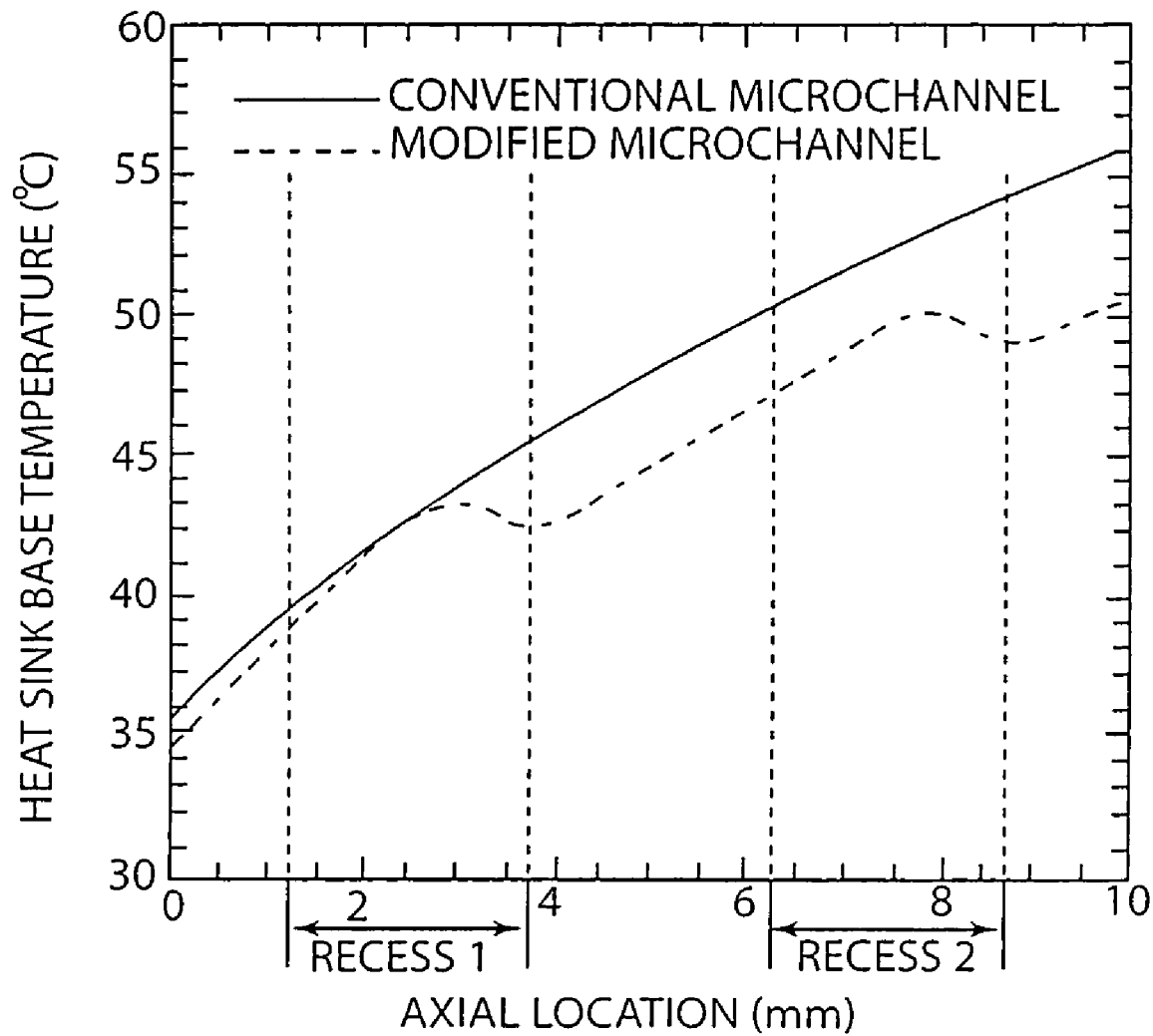
FIG. 4 is a graph of heat sink base temperature versus axial location along a microchannel having two recesses along its length determined by computer simulation software and as compared to that determined for a similar microchannel heat sink without the recesses in the cover.

It is apparent from FIG. 4 that the maximum temperature on the wall 20d of the MODIFIED MICROCHANNEL with the recesses R pursuant to the invention is determined to be a maximum of 50.3 degrees C. with a temperature variation along the length of the wall 20d of 15.7 degrees C. In contrast, it is apparent that the maximum temperature on the wall 20d of the CONVENTIONAL MICROCHANNEL without the recesses R is determined to be a maximum of 55.9 degrees C. with a larger temperature variation along the length of the wall 20d of 20.5 degrees C. The MODIFIED MICROCHANNEL pursuant to the invention resulted in a decrease of −5 degrees C. in both the maximum wall temperature and the temperature variation along the bottom wall 20d based on the microchannel and recess dimensions selected for the simulation.

Figure 5:
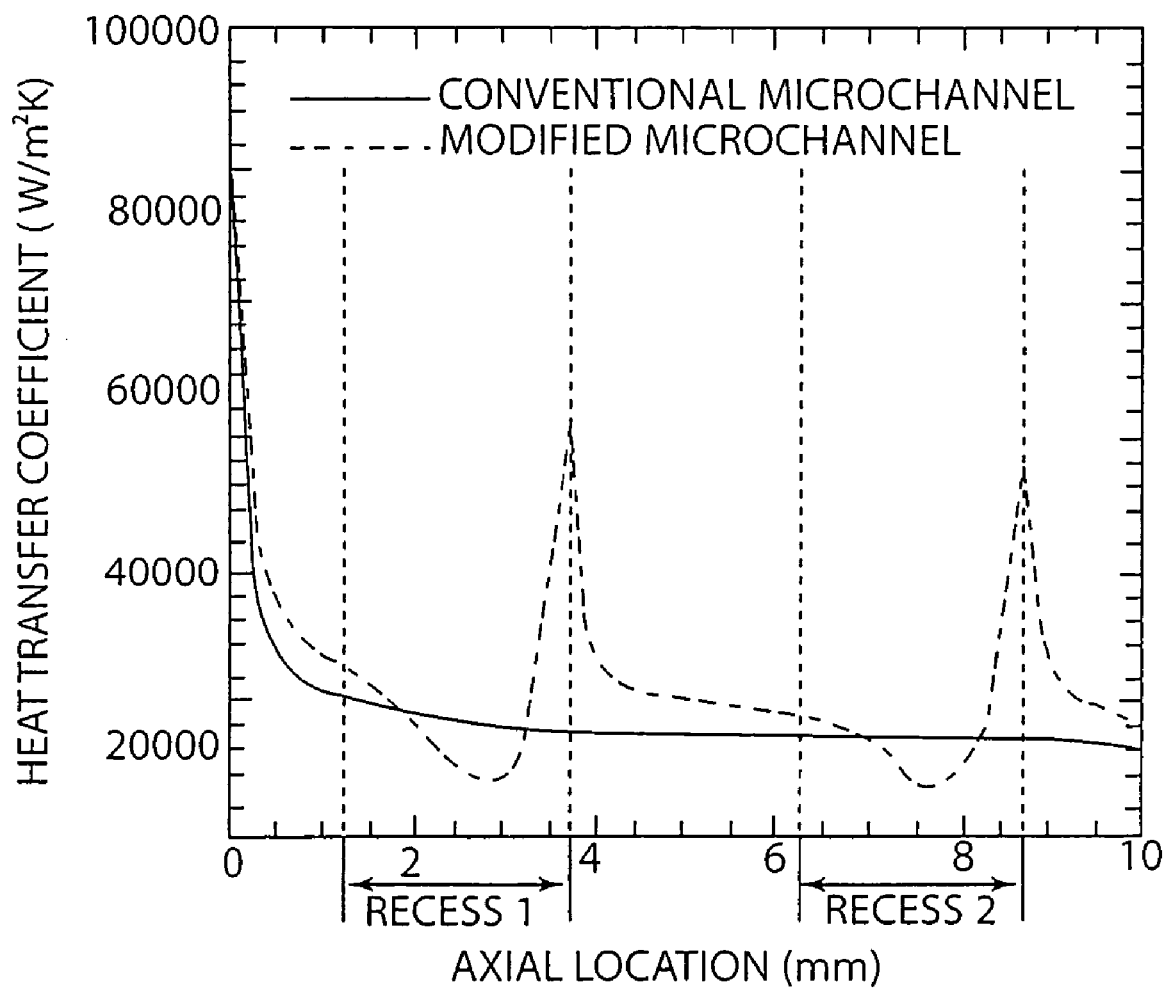
FIG. 5 is a graph of heat transfer coefficient versus axial location along a microchannel having two recesses along its length determined by computer simulation software and as compared to that determined for a similar microchannel heat sink without the recesses in the cover.

In addition, the heat transfer coefficient is enhanced locally by a much as 100% at the downstream end regions E of the recesses R (relative to the direction of fluid flow) as a result of reinitialization of boundary layers as the fluid flow re-enters the microchannels 20. For example, FIG. 5 includes a graph of heat transfer coefficient versus axial location along a microchannel 20 pursuant to the invention (designated MODIFIED MICROCHANNEL) having two recesses R along its length at the axial locations shown determined by computer simulation software (e.g. FLUENT 6.0 commercially available software). For comparison, FIG. 5 includes a graph of heat transfer coefficient versus axial location along a microchannel 20 pursuant to a conventional microchannel (designated CONVENTIONAL MICROCHANNEL) not having recesses R determined by the same computer simulation software. It is apparent that the local heat transfer coefficient is increased by a much as 100% near the downstream end regions E of the recesses R for the MODIFIED MICROCHANNEL as compared to that of the CONVENTIONAL MICROCHANNEL. Such localized increases of heat transfer coefficient can be used proximate localized hot spots of elevated temperature of the microelectronic chip 10 to remove heat therefrom.

The invention thus is advantageous to provide enhancement of localized and overall heat transfer rates. The invention can be used to lower maximum chip temperatures in microelectronic apparatus as well as to achieve lower temperature gradients on chips to reduce thermal stresses, improve reliability and increase chip performance. These advantages are achieved using one or more recesses R to provide passive flow modulation with a smaller pressure drop across the microchannels 20 and hence with a lower pumping power. The recesses R can be strategically located so as to achieve higher rates of cooling at desired specific locations, such as proximate hot spots of the chip 10.

Although the invention has been described with respect to certain embodiments thereof, those skilled in the art will appreciate that modifications, additions, and the like can be made thereto within the scope of the invention as set forth in the appended claims.

We claim:

1. Microchannel heat sink comprising a microchannel for receiving a working fluid to remove heat and one or more recesses disposed in a surface communicated to the microchannel to enhance heat transfer rate of the microchannel heat sink.

2. The heat sink of claim 1 wherein the one or more recesses is/are located at one or more local hot spot regions of a heat-generating component to enhance heat transfer rates at the one or more local regions.

3. The heat sink of claim 1 further including a cover that closes off the microchannel, the cover having one or more recesses in a cover surface facing the microchannels such that the recesses communicate to the microchannels and the working fluid to enhance heat transfer rate of the microchannel heat sink.

4. The heat sink of claim 1 wherein the one or more recesses are elongated and extend in a direction transverse to a long axis of a plurality of the microchannels across one, some or all of the microchannels so as to communicate to one, some or all of the microchannels.

5. The heat sink of claim 4 wherein the one or more recesses extend perpendicular to the long axis.

6. Microchannel heat sink comprising a plurality of microchannels for receiving a working fluid to remove heat and a cover that closes off the microchannels, the cover having one or more recesses in a cover surface facing the microchannels such that the recesses communicate to the microchannels and the working fluid to enhance heat transfer rate of the microchannel heat sink.

7. The heat sink of claim 6 wherein the one or more recesses is/are located at one or more local hot spot regions of a heat-generating component to enhance heat transfer rates at the one or more local regions.

8. The heat sink of claim 6 wherein the one or more recesses are elongated and extend in a direction transverse to a long axis of the microchannels across one, some or all of the microchannels so as to communicate to one, some or all of the microchannels.

9. The heat sink of claim 8 wherein the one or more recesses extend in a direction perpendicular to the long axis.

10. Combination of a heat-generating electronic component and the microchannel heat sink of claim 1 in thermal conductive relation with the component.

11. The combination of claim 10 wherein the microchannel is formed integrally in a surface of the component.

12. The combination of claim 10 wherein the component comprises a microelectronic chip.

13. A method of cooling a heat-generating electronic component, comprising disposing the microchannel heat sink of claim 1 in thermal transfer relation with the component and flowing the working fluid through the microchannel to remove heat from the component.

14. A method of cooling a heat-generating electronic component having one or more hot spots, comprising disposing the microchannel heat sink of claim 1 in thermal transfer relation with the component with the one or more recesses disposed in relation to the one or more hot spots to enhance heat transfer rate there and flowing the working fluid through the microchannel to remove heat from the component.

15. The heat sink of claim 1 wherein heat transfer coefficient is increased at a downstream end region of the one or more recesses.

* * * * *